United States Patent
Miyamoto et al.

(10) Patent No.: US 6,879,002 B2
(45) Date of Patent: Apr. 12, 2005

(54) SEMICONDUCTOR DEVICE HAVING AN SOI SUBSTRATE

(75) Inventors: Shoichi Miyamoto, Tokyo (JP); Toshiaki Iwamatsu, Tokyo (JP); Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/431,473

(22) Filed: May 8, 2003

(65) Prior Publication Data

US 2003/0197223 A1 Oct. 23, 2003

Related U.S. Application Data

(63) Continuation of application No. 09/346,726, filed on Jul. 2, 1999, now Pat. No. 6,586,802.

(30) Foreign Application Priority Data

Jan. 14, 1999 (JP) .............................................. 11-7968

(51) Int. Cl.[7] ..................... H01L 31/0392; H01L 27/01; H01L 27/12; H01L 29/00
(52) U.S. Cl. ........................ 257/347; 257/354; 257/506
(58) Field of Search ............................... 257/347–354, 257/506

(56) References Cited

U.S. PATENT DOCUMENTS

| 5,126,817 A | 6/1992 | Baba et al. |
| 5,739,574 A | 4/1998 | Nakamura |

FOREIGN PATENT DOCUMENTS

| JP | 2-222160 | * 9/1990 | |
| JP | 02222160 A | * 9/1990 | ........... H01L/21/76 |
| JP | 6-349940 | 12/1994 | |

* cited by examiner

Primary Examiner—Shouxiang Hu
(74) Attorney, Agent, or Firm—McDermott Will & Emery LLP

(57) ABSTRACT

A semiconductor device comprising an SOI substrate fabricated by forming a silicon layer 3 on an insulating layer 2, a plurality of active regions 3 horizontally arranged in the silicon layer 3, and element isolating parts 5 having a trench-like shape which is made of an insulator 5 embedded between the active regions 3 in the silicon layer 3, wherein the insulating layer 2 has spaces 6 positioned in the vicinity of interfaces between the active regions and the element isolating parts 5, whereby it becomes possible to reduce fixed charges or holes existing on a side of the insulating layer in interfaces between the silicon layer and the insulating layer, which fixed charges or holes are generated in a process of oxidation for forming the insulating layer on a bottom surface of the silicon layer.

2 Claims, 11 Drawing Sheets

F I G. 3
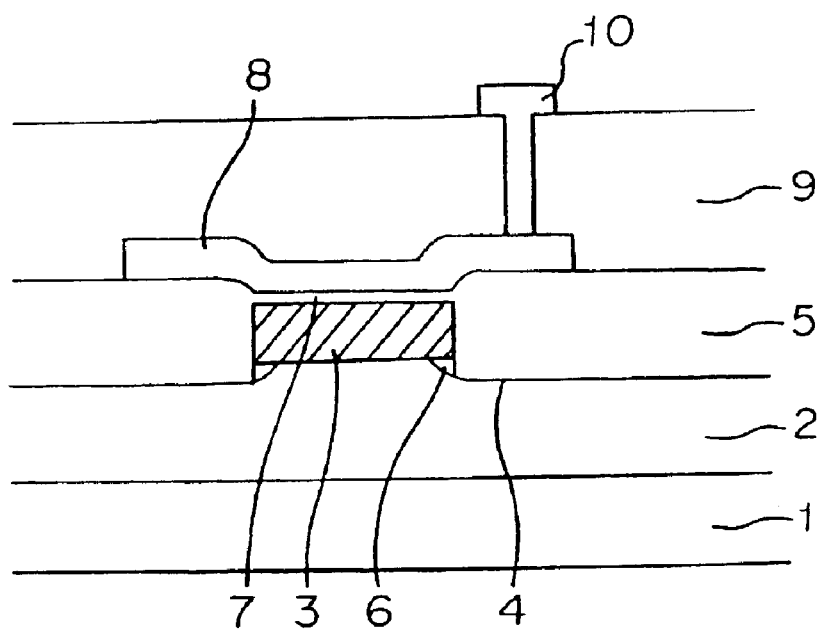

F I G. 5 a
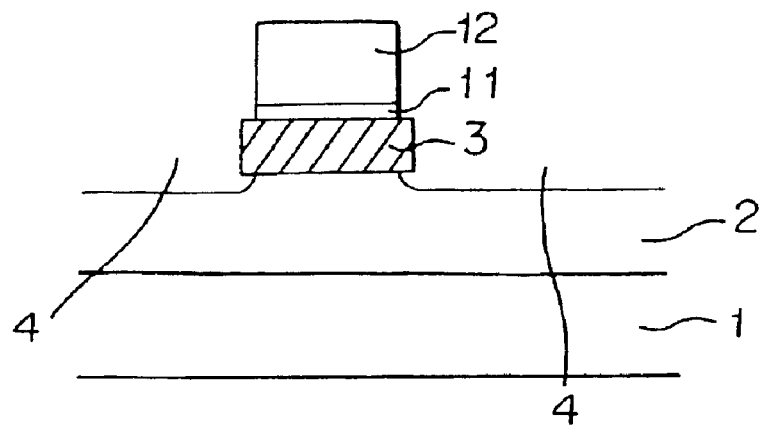
F I G. 5 b
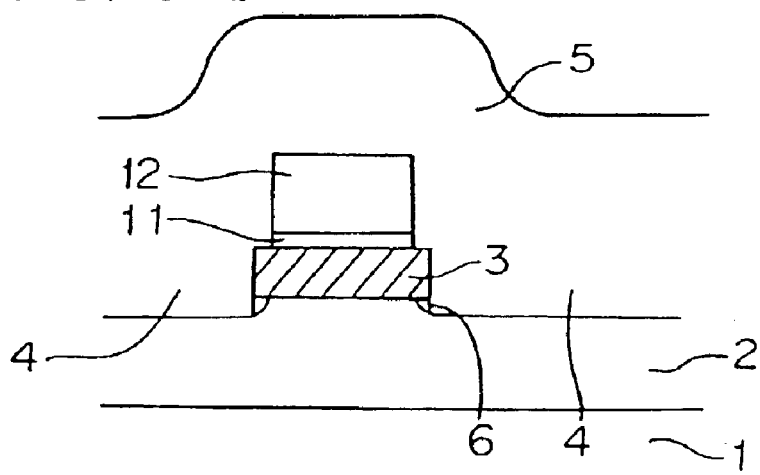
F I G. 5 c
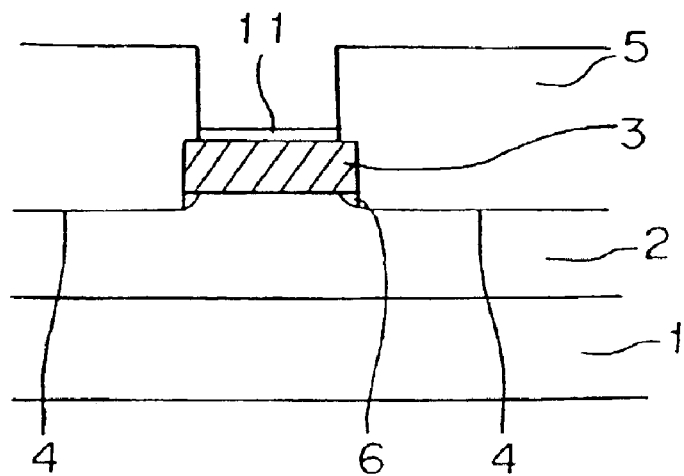

PRIOR ART

F I G. 15
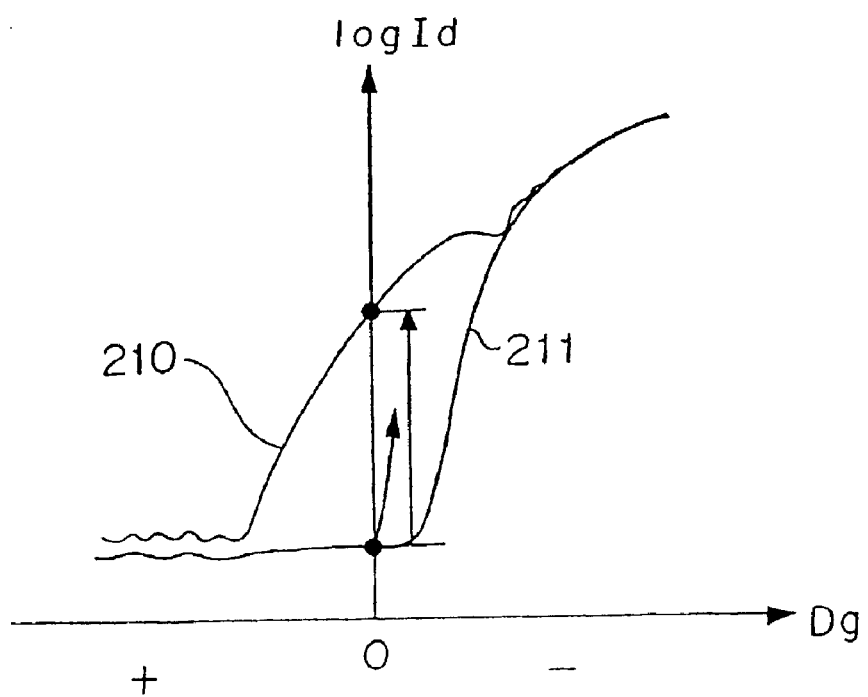

SEMICONDUCTOR DEVICE HAVING AN SOI SUBSTRATE

This application is a continuation of application Ser. No. 09/346,726 filed Jul. 2, 1999 now U.S. Pat. No. 6,586,802.

BACKGROUND OF THE INVENTION

1. Field of the Invention

The present invention relates to a semiconductor device having a silicon on insulator (hereinbelow referred to as SOI) structure in which a silicon layer is formed on an insulating layer, particularly to a semiconductor device having an SOI structure in which isolation of elements is realized by a trench.

2. Discussion of Background

An SOI structure is obtained by forming elements on a silicon layer formed on an insulating layer, not by forming elements on a semiconductor substrate as in conventional semiconductor devices.

FIG. 12 is a cross-sectional view for showing a conventional semiconductor device having the SOI structure. As shown an insulating layer 102 was formed on a semiconductor substrate 101; and a silicon layer 103 was formed on the insulating layer 102, whereby the SOI structure was fabricated.

A plurality of active regions were formed in the silicon layer 103, and an element isolating part was formed between the active regions. In the active regions of the silicon layer 103, source/drain areas 103a were formed by injecting impurities such as phosphorus, arsenic, and boron. Simultaneously, on the silicon layer 103 between the source/drain areas 103a, a gate electrode 108 was formed interposing a gate oxide film 107, whereby a MOS transistor was fabricated. On the other hand, between the active regions, a trench 104 was formed; and an insulator 105 was embedded in an inside of the trench 104, whereby an element isolating area was fabricated.

On an SOI substrate in which MOS transistors were formed, an inter-layer insulating film was formed; a conductive wire 110 was formed on the inter-layer insulating film 109; and contact holes, in which a conductive material was embedded to electrically connect the wire 110 to the source/drain area 103a in the silicon layer 103, was formed in the inter-layer insulating film 109.

In the conventional semiconductor device having the above-mentioned SOI structure, a technique that a space 106 was formed above an interface, between the silicon 103 in a trench 104 and an insulating layer 102, positioned in a central portion of the trench 104, and stress caused in the trench 104 was absorbed and relaxed by the space 106 in order to deal with such stress caused in accordance with a volume change of the insulator, which was an element isolating area, was disclosed in JP-A-6-349940.

As a method of forming a silicon layer on an insulating layer, there were proposed a recrystallizing method for depositing an amorphous thin film or a polycrystalline thin film on an insulating layer and succeedingly recrystallizing this, an epitaxial method for depositing a crystalline thin film first on the insulating layer, an insulating layer embedding method of preparing a single crystal wafer and embedding the insulating layer thereinto, and a bonding method of bonding a single crystal wafer to an insulator.

Among these method, the recrystallizing method and the epitaxial method did not cause oxidation of the insulating layer at a time of forming the silicon layer on the insulating layer. On the other hand, the insulating layer embedding method and the bonding method were to form the insulating layer by oxidizing a silicon layer because, in the insulating layer embedding method, the insulating layer was formed by implanting oxygen and nitrogen into a single crystal wafer and oxidizing this, and, in the bonding method, the insulating layer was formed by thermal oxidation on the single crystal wafer and bonding to other wafers. In such an SOI substrate formed along with oxidation of the silicon layer, fixed positive charges were generated in a region which is in the insulating layer of the SOI substrate and within about 200 Å from an interface between the insulating layer and the silicon layer, during a process of oxidation. Therefore, when the SOI substrate of the conventional semiconductor device was formed by the insulating layer embedding method or the bonding method, there was a possibility that the SOI substrate was affected by the fixed charges existing in the insulating layer. Particularly, when an n-type MOS transistor was formed, a parasitic MOS was apt to be generated in a silicon layer in the vicinity of a gate electrode by an effect of the positive fixed charges.

The parasitic MOS cause the following disadvantages. FIGS. 14a and 14b respectively are schematical plan and cross sectional views for illustrating the parasitic MOS produced in a transistor. Numerical reference 200 designates a parasitic MOS; numerical reference 201 designates a gate of transistor; numerical reference 202 designates a transistor; and numerical reference 203 designates an SOI layer.

Such a parasitic MOS 200 is produced on an end of a device such as the transistor 202 illustrated in FIGS. 14a and 14b. When a threshold voltage Vth of the parasitic MOS became lower than that of the transistor, there was a problem that a leakage current was increased.

FIG. 15 illustrates properties of a drain current Id—a gate voltage Vg both in a case that Vth of the parasitic MOS is decreased and a case that this Vth is ideal, in which numerical reference 210 designates the case that Vth of the parasitic MOS is increased, and numerical reference 211 designates the case that Vth is ideal.

In the case 210, when Vg=0V, Id is increased to cause the increment of the leakage current in comparison with the case 211.

Incidentally, the SOI substrate was formed by methods other than the insulating layer embedding method and the bonding method, the above-mentioned fixed charges were not generally generated. However, in a case that the device was used under circumstances, which were exposed to many radiations as in a nuclear electric power station and an artificial satellite, radiations entered into the insulating layer and therefore pairs of an electron and a hole were generated in the insulating layer. Thus, an effect similar to that by the positive charges was generated by these holes.

SUMMARY OF THE INVENTION

It is an object of the present invention to solve the above-mentioned problems inherent in the conventional technique and to provide a semiconductor device, in which fixed charges or holes existing on a side of the insulating layer of an interface between a silicon layer and the insulating layer are decreased.

Another object of the present invention is to provide a semiconductor device, in which parasitic MOS in a silicon layer in the vicinity of gate electrodes can be prevented from generating.

According to the first aspect of the present invention, there is provided a semiconductor device comprising an SOI substrate in which a silicon layer is formed on an insulating layer, a plurality of active regions disposed in the silicon layer to be horizontally arranged, and an element isolating part of trench-like shape made of an insulator embedded between the active regions in the silicon layer, wherein the insulating layer includes spaces positioned in the vicinity of interfaces between the active regions and the element isolating part.

According to the second aspect of the present invention, there is provided the semiconductor device in which the element isolating parts are embedded to reach an inside of the insulating layer of the SOI substrate.

According to the third aspect of the present invention, there is provided the semiconductor device in which an insulating layer embedding method or a bonding method is used to form the SOI substrate to enable fixed charges generated in the insulating layer to decrease by forming the spaces even not under special conditions, wherein a mechanism of decreasing the fixed charges is to relax a stress caused at an interface between $SiO_2$ and Si by a difference of their coefficients of thermal expansion and a thermal budget in a process of semiconductor wafer, the stress cuts dangling bonds between $SiO_2$ and Si to resultantly generate the fixed charges.

According to the forth aspect of the present invention, there is provided a semiconductor device comprising an SOI substrate in which a silicon layer is formed on an insulating layer, a plurality of active regions formed in the silicon layer to be horizontally arranged, and element isolating parts having trench-like shape made of insulators embedded between the active regions in the silicon layer, wherein the active regions include an MOS transistor composed of source/drain areas arranged opposite each other with respect to the element isolating parts in the silicon layer and a gate electrode arranged on the silicon layer between the source/drain areas; and the insulating layer includes spaces positioned in the vicinity of interfaces between the active regions and the element isolating parts.

According to the fifth aspect of the present invention, there is provided the semiconductor device in which the gate electrodes extend on the interfaces between the active regions and the element isolating parts.

According to the sixth aspect of the present invention, there is provided the semiconductor device in which the MOS transistors is n-type and the spaces are positioned in the vicinity of the interfaces in consideration of generation of a parasitic metal oxide semiconductor in the vicinity of channels of the MOS transistors.

BRIEF DESCRIPTION OF THE DRAWINGS

A more complete appreciation of the invention and main of the attendant advantages thereof will be readily obtained as same becomes better understood by reference to the following detailed description when considered in connection with the accompanied drawings, wherein:

FIG. 3 is a cross-sectional view for schematically showing a part of the semiconductor device according to Embodiment 1 of the present invention;

FIG. 5a is a cross-sectional view for illustrating a method of producing the semiconductor device shown in FIG. 1;

FIG. 5b is a cross-sectional view for illustrating a method of producing the semiconductor device shown in FIG. 1;

FIG. 5c is a cross-sectional view for illustrating a method of producing the semiconductor device shown in FIG. 1;

FIG. 15 is a diagram for illustrating properties of Id-Vg with respect to Vth of the parasitic MOS.

DETAILED DESCRIPTION OF THE PREFERRED EMBODIMENTS

A detailed explanation will be given of preferred embodiments of the present invention in reference of FIGS. 1 through 12 as follows, wherein the same numerical references are used for the same or the similar portions and description of these portions is omitted.

Embodiment 1

Figure 1:
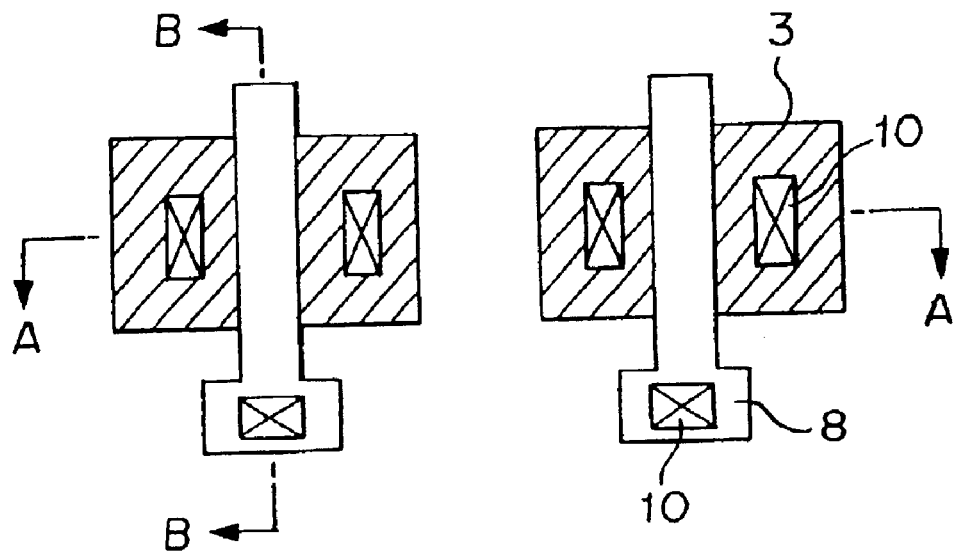
FIG. 1 is a plan view of an important portion of a semiconductor device according to Embodiment 1 of the present invention.
Figure 2:
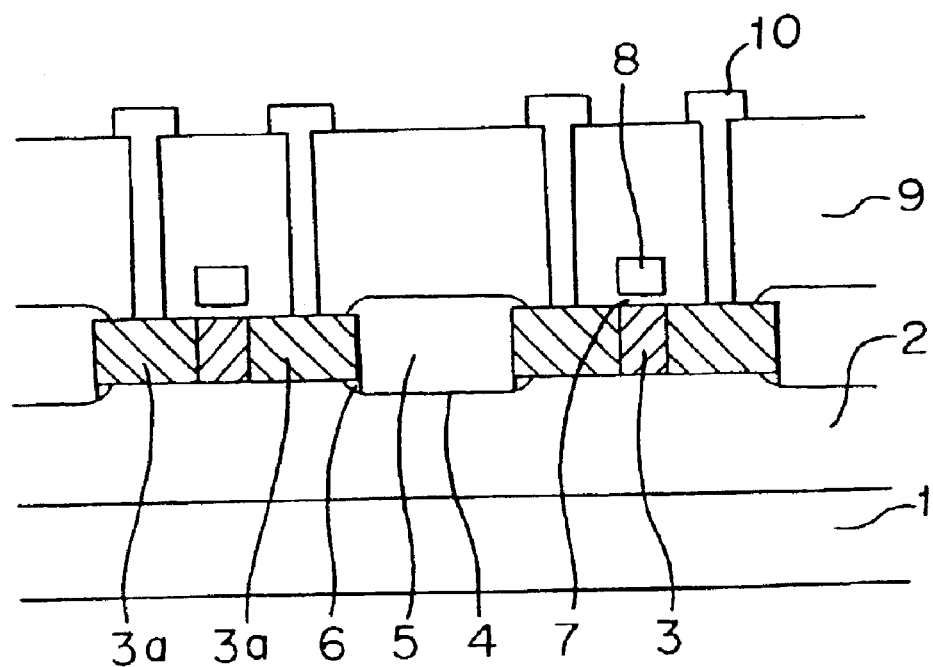
FIG. 2 is a cross-sectional view for schematically showing a part of the semiconductor device according to Embodiment 1 of the present invention.

FIGS. 1 through 3 show a semiconductor device according to Embodiment 1 of the present invention, wherein FIG. 1 is a plan view for schematically showing the semiconductor device in which an insulating film and so on are omitted for the purpose of the readiness; FIG. 2 is a cross-sectional view taken along a line A—A in the semiconductor device shown in FIG. 1; and FIG. 3 is a cross-sectional view taken along a line B—B of the semiconductor device shown in FIG. 1.

As shown in these Figures, an insulating layer 2 is formed on a semiconductor substrate 1; and a silicon layer 3 is formed on the insulating layer 2, whereby an SOI structure having the silicon layer 3 on the insulating layer 2 is fabricated.

This SOI structure may be formed by any method as long as the method produces fixed charges in the insulating layer of the SOI substrate, for example an insulating layer embedding method represented by an ion implanting method such as oxygen implanting (SIMOX) and nitrogen implanting and a method using oxidation of porous silicon (FIPOS), a method of bonding wafers, or the like.

In the silicon layer 3, a plurality of active regions are formed, wherein element isolating parts are formed between the active regions. A MOS transistor is fabricated by forming source/drain areas 3a by injecting impurities such as phosphorus, arsenic, and boron in the active regions within the silicon layer 3 and forming a gate electrode 8 via a gate oxidation film 7 on the silicon layer 3 between the source/drain areas 3a.

In this embodiment, an n-type MOS transistor is fabricated by forming source/drain areas 3a by injecting impurities such as phosphorus and arsenic.

On the other hand, a trench 4 is formed to reach not only the silicon layer 3 but also the insulating layer 2 positioned below the silicon layer 3 and to spread beneath side walls of the silicon layer 3. Although an insulator 5 is formed in the trench 4, a space 6 is formed instead of the insulator 5 beneath a side portion of the silicon layer 3, where the trench 4 spreads beneath the silicon layer 3. The element isolating area is composed of the trench 4, in which the insulator 5 is formed.

On the SOI substrate having an MOS transistor, an inter-layer insulating film 9 is formed on the SOI substrate having the MOS transistors. A conductive wire 10 is formed in the inter-layer insulating film 9 for electrically connecting to the source/drain areas 3a of the silicon layer 3 through a contact hole formed in the inter-layer insulating film 9, wherein the conductor is embedded to form the conductive wire.

In the next, a method of manufacturing the semiconductor device shown in FIG. 1 will be described.

FIGS. 4a through 6b illustrate steps of manufacturing the semiconductor device shown in FIGS. 1 through 3 for explanation, wherein these Figures are cross-sectional views taken along a line B—B of the semiconductor device shown in FIG. 1.

Figure 4A:
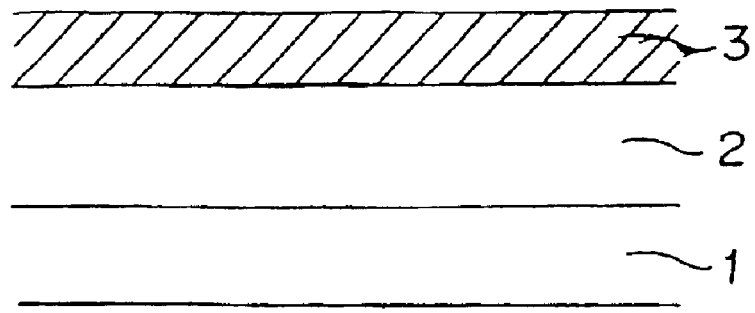
FIG. 4a is a cross-sectional view for illustrating a method of producing the semiconductor device shown in FIG. 1.

As illustrated in FIG. 4a, the SOI substrate, which is fabricated by forming the insulating layer 2 made of for example silicon oxide on the semiconductor substrate 1 and forming the silicon layer 3 on the insulating layer 2, is prepared. The SOI substrate is formed by an insulating layer embedding method represented by an ion implanting method such as separation by Implanted Oxygen (SIMOX), nitrogen implantation, or the like, and a method of using oxidation of porous silicon (FIPOS), or a bonding method.

Figure 4B:
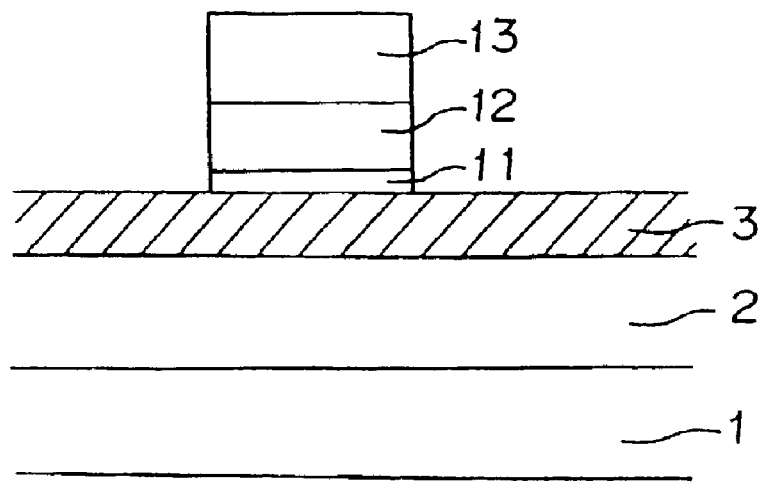
FIG. 4b is a cross-sectional view for illustrating a method of producing the semiconductor device shown in FIG. 1.

In the next, as shown in FIG. 4b, after forming underlying oxide film 11 having a thickness of about 100 through 300 Å on the silicon layer 3 by forming a tetraethoxysilane (TEOS) oxide film or oxidizing the silicon layer 3, a nitride film 12 having a thickness about 2,000 Å is deposited on the pad oxide film 11. Thereafter, a resist 13 is patterned on the nitride film 12 so as to be in correspondence with active regions of the silicon layer 3, and portions of the nitride film 12 and the pad oxide film 11, which are not positioned below the resist 13, are removed by dry etching.

Figure 4C:
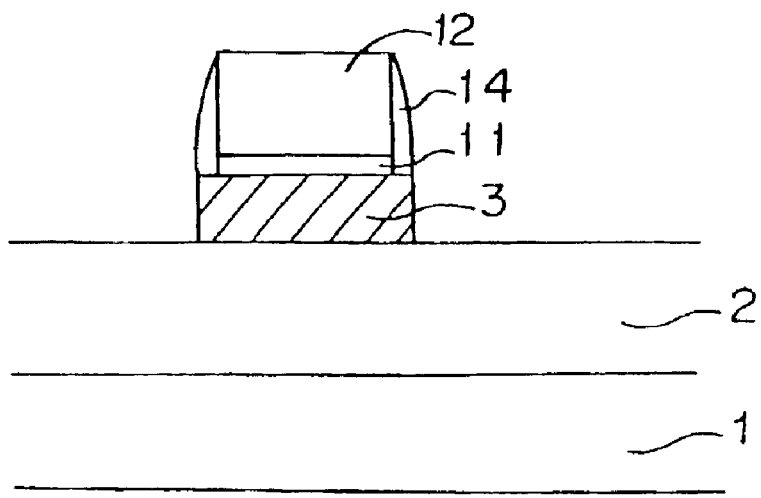
FIG. 4c is a cross-sectional view for illustrating a method of producing the semiconductor device shown in FIG. 1.

In the next, as illustrated in FIG. 4c, after removing the resist 13, a TEOS oxide film having a thickness of about 500 Å is deposited. Thereafter, a portion of the TEOS oxide film is removed by etching so that a side wall 14 of TEOS oxide film is formed in a side wall of the nitride film 12 formed on the silicon layer 3 in a self-replicating manner.

The silicon layer 3 is dry-etched under an anisotropic condition using thus formed nitride film 12 and side wall 14 as masks, and a portion of silicon layer 3, which is not covered by the nitride film 12 and side wall 14, is removed.

In the next, as illustrated in FIG. 5a, etching is conducted by hydrogen chloride using a mask of the nitride film 12 and the side wall 14 to remove the insulating layer 2 as much as, for example, about 500 Å. At this time, a portion of insulating layer 2 externally exposed and a portion of the insulating layer 2 positioned below side portions of the silicon layer 3 are etched and removed.

The above-mentioned etching is sufficient to be able to remove the insulating layer 2. The thickness of the insulating layer 2 to be removed is changed depending on the thickness of the oxide film consisting of the insulating layer 2 and is generally between 1 through 1,000 Å.

As illustrated in FIG. 5b, after the etching, a deposition oxide film 5 is formed by a low-temperature CVD to have a film thickness larger than that of a step difference between the active region and the isolating area, for example, about 5,000 Å. At this time, the deposition oxide film 5 is not deposited in the portion where the insulating layer 2 was removed below the silicon layer 3, and instead the space 6 is formed.

Incidentally, because the deposition oxide film 5 is formed at the portions etched below the silicon layer 3, if a temperature is too high in the above low-temperature CVD, the temperature is preferably 350 through 500° C., more preferably around 400° C.

In the next, as illustrated in 5c, the deposition oxide film 5 is planarized by abrading until the nitride film 12 is exposed using chemical mechanical polishing (CMP). Succeedingly, the nitride film 12 is removed by a phosphoric acid having a temperature of about 160° C.

Figure 6A:
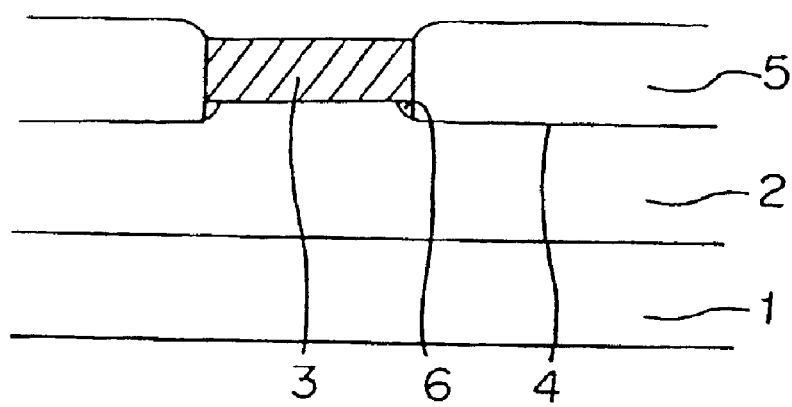
FIG. 6a is a cross-sectional view for illustrating a method of producing the semiconductor device shown in FIG. 1.

In the next, as illustrated in FIG. 6a, a channel is formed by injection in the active region of the silicon layer 3, and simultaneously the pad oxide film 11 and the side wall 14 are removed by a phosphoric acid.

Figure 6B:
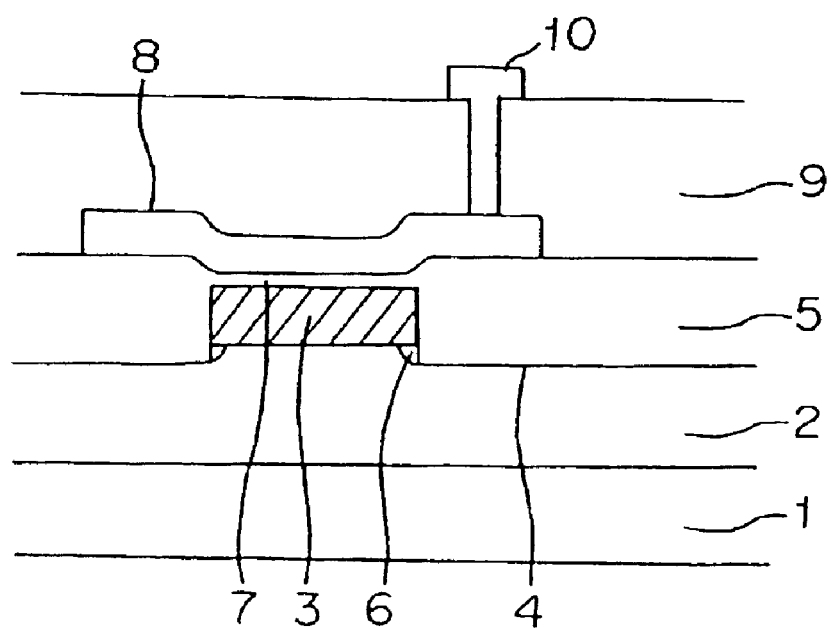
FIG. 6b is a cross-sectional view for illustrating a method of producing the semiconductor device shown in FIG. 1.

In the next, as illustrated in FIG. 6b, after forming a gate oxide film 7 having a thickness of for example about 70 Å and a gate electrode 8 having a thickness of about 2,000 Å, a source and a drain are formed by injection Further, after forming the interlayer insulating film 9, a wire 10 made of aluminum or the like is formed on the inter-layer insulating film 9, and simultaneously a contact hole, in which a conductor is embedded, is formed in the inter-layer insulating film 9 so that the wire 10 is electrically connected to the source/drain areas, whereby an SOI-MOS transistor is obtainable.

Since the semiconductor device according to Embodiment 1 of the present invention is fabricated to have the spaces below side portions of the silicon in the insulating layer of the SOI substrate, it is possible to avoid generation of fixed charges existing in an interface between the silicon layer and the insulating layer. Therefore, it is possible to restrict production of a parasitic MOS caused by the fixed charges when NMOS and so on are used. A mechanism of decreasing the fixed charges by the spaces is to relax a stress caused at an interface between $SiO_2$ and Si by a difference of their coefficients of thermal expansion and a thermal budget in a process of semiconductor wafer, the stress cuts dangling bonds between $SiO_2$ and Si to resultantly generate the fixed charges.

Further, such a parasitic MOS produced at a time of using nMOS and so on is mainly caused by fixed charges existing at around an interface between the silicon and the device isolation. Therefore, by forming the spaces at around the interface between the silicon and the device isolation, it becomes possible to restrict production of the parasitic MOS.

Further, since the spaces are formed by depositing the insulating film in the trench after removing the portion of the insulating layer below the silicon by etching, it becomes possible to form the spaces below the silicon in the vicinity of the interface between the silicon and the device isolation.

Embodiment 2

Figure 7:
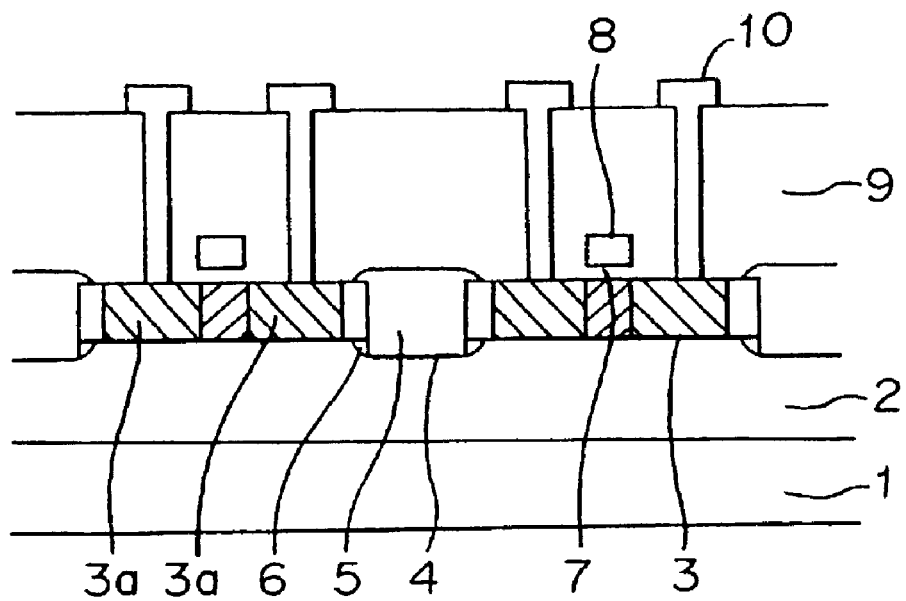
FIG. 7 is a cross-sectional view for schematically showing a part of a semiconductor device according to Embodiment 2 of the present invention.
Figure 8:
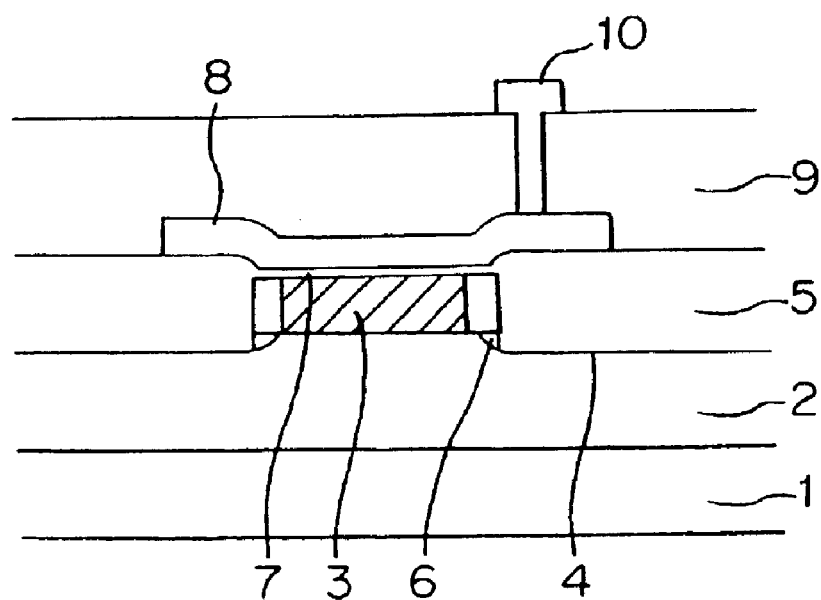
FIG. 8 is a cross-sectional view for schematically showing a part of a semiconductor device according to Embodiment 2 of the present invention.

In the semiconductor device according to Embodiment 1, the spaces are formed below the silicon layer. However, in a semiconductor device according to Embodiment 2 of the present invention, spaces are formed on a side of an element isolating area in an interface between the silicon layer and the element isolating area. FIGS. 7 and 8 are cross-sectional views for showing the semiconductor device according to Embodiment 2, wherein FIG. 7 is taken along a line A—A of the semiconductor device shown in FIG. 1 and FIG. 8 is taken along a line B—B of this semiconductor device As shown in FIGS. 7 and 8, the insulating layer 2 is formed on a semiconductor substrate 1, and the silicon layer 3 is formed on the insulating layer 2, whereby an SOI structure is fabricated.

A plurality of active regions are formed in silicon layer 3. Element isolating parts are formed between the active regions. Source/drain areas 3a are formed in the active regions in the silicon layer 3 by injecting impurities such as phosphorus, arsenic, and boron, and simultaneously, a gate electrode 8 is formed on the silicon layer 3 between the source/drain areas 3a interposing a gate oxide film 7, whereby an MOS transistor is fabricated.

In Embodiment 2, the source/drain areas 3a are formed by implanting impurities such as phosphorus and arsenic to fabricate an n-type MOS transistor.

On the other hand, between the active regions, a trench 4 is formed to reach not only the silicon layer 3 but also the insulating film 2 below the silicon layer 3. A space 6 is formed below the insulating film formed in a side wall of the silicon layer 3, and an insulator 5 is formed in the trench 4, whereby the element isolating area is fabricated.

An inter-layer insulating film 9 is formed on an SOI substrate, in which the MOS transistor is formed, and simultaneously a conductive wire 10 is formed on the inter-layer insulating film 9, in which a contact hole embedding a conductor for electrically conducting the source/drain area in the silicon layer 3 to the wire 10, is formed.

In the next, a method of manufacturing the semiconductor device shown in FIGS. 7 and 8 will be described.

FIGS. 9a through 11c show steps of manufacturing the semiconductor device shown in FIGS. 7 and 8, wherein FIGS. 9a through 11c are cross-sectional views taken along B—B of the semiconductor device illustrated in FIG. 1.

Figure 9A:
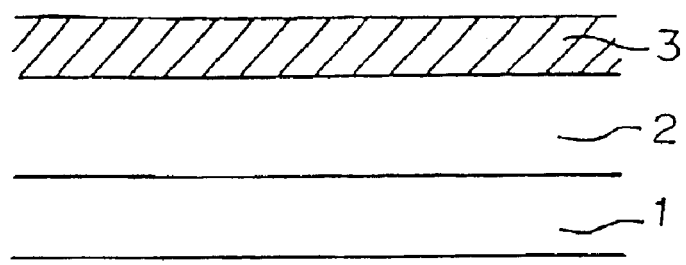
FIG. 9a is a cross-sectional view for illustrating a method of producing the semiconductor device shown in FIGS. 7 and 8.

At first, as shown in FIG. 9a, the SOI substrate having the insulating layer 2 made of for example silicon oxide formed on a semiconductor substrate 1 and the silicon layer 3 formed on the insulating layer 2 are prepared. The SOI substrate can be formed by any method, for example, a separation by implanted oxygen (SIMOX) method or a wafer bonding method. In Embodiment 2, an SOI substrate formed by the SIMOX method is used.

Figure 9B:
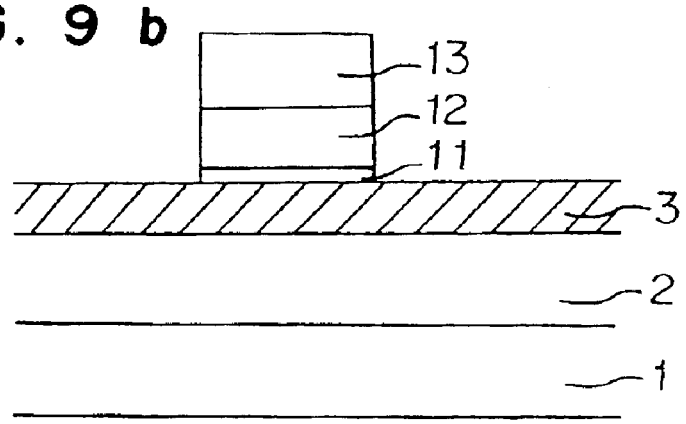
FIG. 9b is a cross-sectional view for illustrating a method of producing the semiconductor device shown in FIGS. 7 and 8.

In the next, as shown in FIG. 9b, after forming a pad oxide film 11 having a thickness of about 100 through 300 Å on the silicon layer 3 by forming a tetraethoxysilane (TEOS) oxide film or oxidizing an SOI layer 3, a nitride film 12 having a thickness of about 2,000 Å is deposited on the pad oxide film 11.

Thereafter, a resist 13 is patterned on the nitride film 12 so as to be in correspondence with an active region of the silicon layer 3. Portions of the nitride film 12 and the pad oxide film 11, which are not positioned below the resist 13, are removed by dry etching.

Figure 9C:
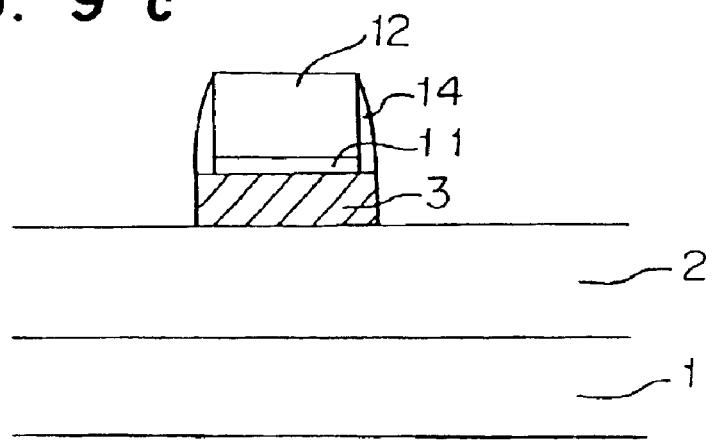
FIG. 9c is a cross-sectional view for illustrating a method of producing the semiconductor device shown in FIGS. 7 and 8.

In the next, as illustrated in FIG. 9c, after removing the resist 13, a TEOS oxide film having a thickness of about 500 Å is deposited. Thereafter, a portion of the TEOS oxide film is removed by etching so that a side wall 14 of the TEOS oxide film is formed only in a side surface of the nitride film 12 formed above silicon layer 3 in a self-replicating manner.

The silicon layer 3 is dry-etched under an anisotropic condition using thus formed nitride film 12 and thus formed side wall 14 as masks to remove the portion of the silicon layer 3, which is not covered by the nitride film 12 and the side wall 14.

Figure 10A:
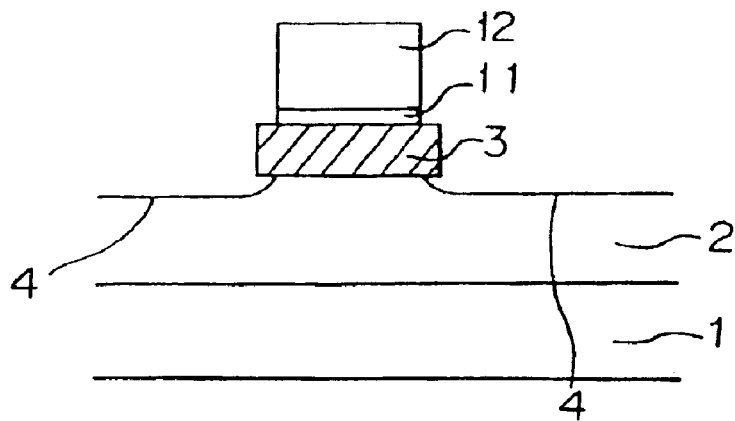
FIG. 10a is a cross-sectional view for illustrating a method of producing the semiconductor device shown in FIGS. 7 and 8.

In the next, as illustrated in FIG. 10a, etching by hydrogen fluoride is conducted using the nitride film 12 and the side wall 14 as masks to remove the insulating layer 2 as much as, for example about 500 Å. At this time, an externally exposed portion of the insulating layer 2 and a portion of the insulating layer 2 positioned below a side of the silicon layer 3 are removed by etching, wherein the portions below the side of the silicon layer 3 are etched as if digging under the side of the silicon layer 3.

Figure 10B:
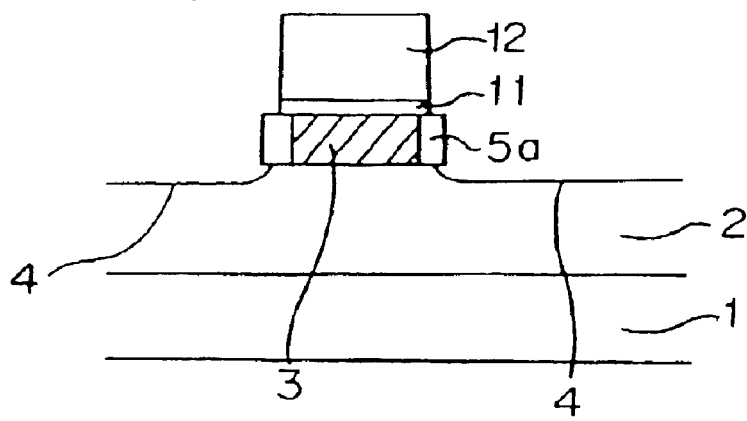
FIG. 10b is a cross-sectional view for illustrating a method of producing the semiconductor device shown in FIGS. 7 and 8.

In the next, as shown in FIG. 10b, oxidation is conducted to form an oxide film 5a on a side of the silicon layer 3. This oxidation is performed by conducting a heat treatment with respect to the side of the silicon layer 3 to form a thermal oxide film 5a. The film thickness of the oxide film 5a depends on a position at which the space is formed or the diameter of the trench 4 and is preferably 1 through 1,000 Å, more preferably around 500 Å.

Figure 10C:
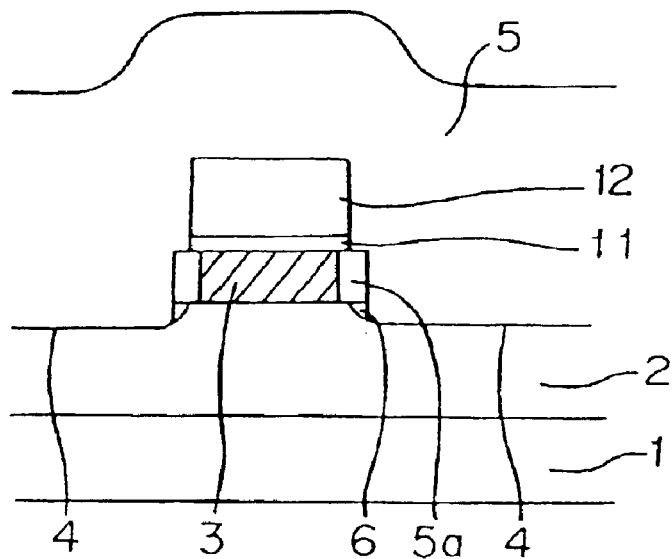
FIG. 10c is a cross-sectional view for illustrating a method of producing the semiconductor device shown in FIGS. 7 and 8.

Thereafter, as illustrated in FIG. 10c, a deposition oxide film 5 is formed to have a film thickness of for example about 5,000 Å, which is larger than a step difference between the active region and an isolating area. At this time, the deposition oxide film 5 is not deposited below the above thermal oxide film 5a, wherein a space 6 is formed.

Figure 11A:
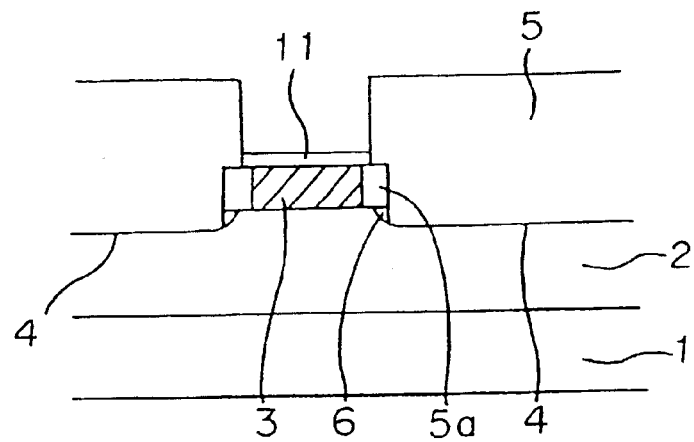
FIG. 11a is a cross-sectional view for illustrating a method of producing the semiconductor device shown in FIGS. 7 and 8.

Thereafter, as illustrated in FIG. 11a, the deposition oxide film 5 is planalized by abrading until the nitride film 12 is exposed using chemical mechanical polishing (CMP), and the nitride film 12 is removed by hydrogen fluoride having a temperature of about 160° C.

Figure 11B:
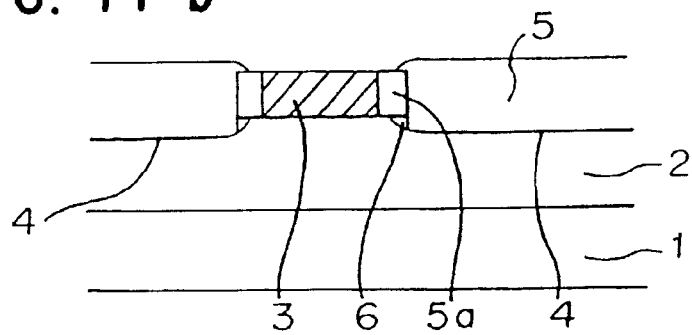
FIG. 11b is a cross-sectional view for illustrating a method of producing the semiconductor device shown in FIGS. 7 and 8.

In the next, as illustrated in FIG. 11b, a channel is formed by injection in the active region of the silicon layer 3, and simultaneously the pad oxide film 11 and the side wall 14 are removed by hydrogen fluoride.

Figure 11C:
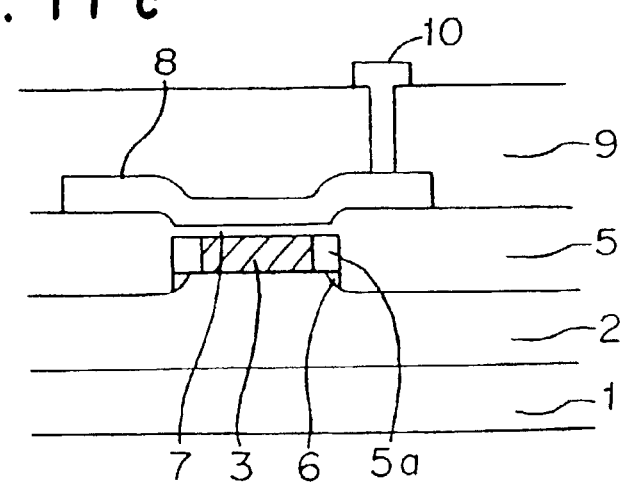
FIG. 11c is a cross-sectional view for illustrating a method of producing the semiconductor device shown in FIGS. 7 and 8.
Figure 12:
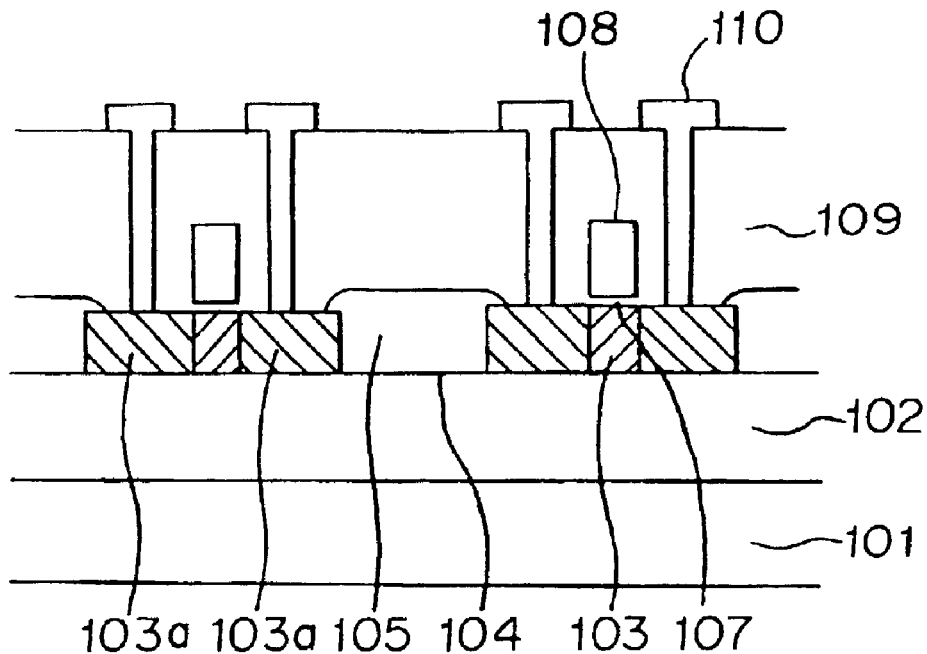
FIG. 12 is a cross-sectional view for schematically showing a part of conventional semiconductor device.
Figure 13:
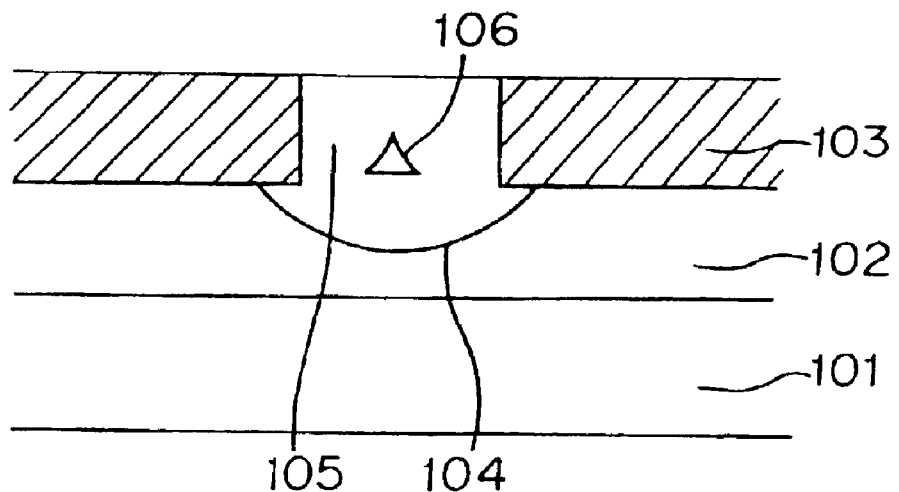
FIG. 13 is a cross-sectional view for schematically showing a part of conventional semiconductor device
Figure 14A:
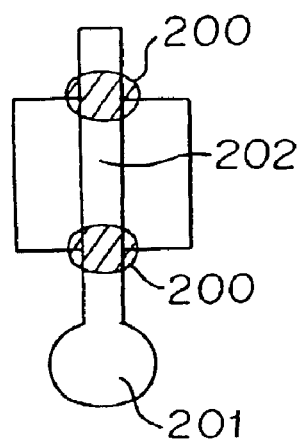
FIG. 14a is a plan view for schematically illustrating a parasitic MOS produced in a transistor.
Figure 14B:
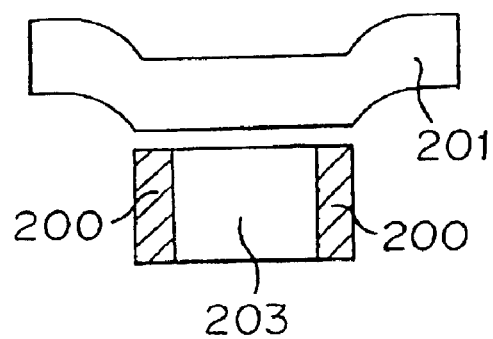
FIG. 14b is a cross sectional view for schematically illustrating the parasitic MOS produced in the transistor.

In the next, as illustrated in FIG. 11c, after forming a gate oxide film 7, for example, having a film thickness of about 70 Å and a gate electrode 8 having a film thickness of about 2,000 Å, a source and a drain are formed by injection. Further, after forming the inter-layer insulating film 9, a wire 10 made of such as aluminum is formed on the inter-layer insulating film 9 and a contact hole, in which a conductor is embedded, is formed in the inter-layer insulating film 9 so that the wire 10 is electrically connected to the source/drain area, whereby an SOI-MOS transistor is obtainable.

Since the semiconductor device according to Embodiment 2 has the spaces formed below the thermal oxide film formed on a side of the silicon layer, it is possible to remove fixed charges existing on a side of insulating layer in an interface between the silicon layer and the insulating layer. Accordingly, it becomes possible to restrict production of a parasitic MOS caused by the fixed charges at a time of using an nMOS and so on.

Further, the parasitic MOS generated at a time of using nMOS transistor or the like is mainly caused by fixed charges existing in the vicinity of an interface between the silicon and the device isolation. Therefore, by forming the spaces in the vicinity of the interfaces between the silicon and the device isolation, it becomes further possible to restrict production of the parasitic MOS.

Further, since the insulating layer deposited below the silicon is removed by etching; the thermal oxidation film is formed on the side of silicon; and the spaces are formed by depositing the insulating film in the trench, it becomes possible to form the space below the thermal oxidation film formed on the side of the silicon.

The SOI structure according to Embodiments 1 and 2 formed by a method, in which fixed charges are generated in the insulating layer of the SOI substrate, an ion implanting method such as implanting oxygen (SIMOX) or nitrogen and an insulating layer embedding method represented by a method using oxidation of porous silicon (FIPOS), the wafer bonding method, or the like, are exemplified. However, the present invention is not limited thereto and is applicable to an SOI substrate formed by other method.

In this case, although fixed charges are not ordinarily generated in a surface layer of the insulating layer, for example in a case that a device is used under circumstances susceptible to radiations, for example nuclear power stations and artificial satellites, radiations are received in the insulating layer and therefore pairs of electron and hole are generated in the insulating layer. Accordingly, when holes are trapped in the insulating layer, the holes work in a similar manner to positive electric charges. When the above-mentioned SOI substrate is used in accordance with Embodiments 1 and 2 of the present invention, it becomes possible to remove holes existing on a side of the insulating layer in an interface between the silicon layer and the insulating layer, and therefore it becomes possible to restrict production of the parasitic MOS caused by holes at a time of using nMOS or the like.

The first advantage of the present invention is that fixed charges or holes can be removed when the fixed chares or the holes are generated on the side of the insulating layer in the interface between the silicon layer and the insulating layer.

The second advantage of the present invention is that it becomes easy to form the space in the insulating layer when the element isolating part having a trench-like shape is embedded so as to reach the insulating layer of the SOI substrate.

The third advantage of the present invention is that fixed charges generated on the side of the insulating layer in the interface between the silicon layer and the insulating layer can be removed when the SOI substrate is formed by an insulating layer embedding method or a bonding method.

The fourth advantage of the present invention is that it becomes possible to reduce influences of fixed charges or holes on the MOS transistor when the fixed charges or the holes are generated on the side of the insulating layer in the interface between the silicon layer and the insulating layer.

The fifth advantage of the present invention is that it becomes further possible to reduce influences of fixed charges or holes when the gate electrode extends to the interface between the element receiving part and the element isolating part, and the space is positioned in the vicinity of the interface.

The sixth advantage of the present invention is that it becomes possible to restrict production of a parasitic MOS caused by fixed charges or holes when the n-type MOS transistor is fabricated.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device comprising:
   an SOI substrate fabricated by forming a silicon layer on an insulating layer;
   a plurality of active regions which are horizontally arranged in said silicon layer; and
   element isolating parts having a trench-like, which are respectively made of an insulator, between each of neighboring active regions in said silicon layer and extending into the insulating layer,
   wherein said insulating layer has hollow spaces positioned in the vicinity of interfaces between said active regions and said element isolating parts and extending under said active regions; and each of said hollow spaces has a side edge aligned with a corresponding one of said interfaces.

2. A semiconductor device comprising:
   an SOI structure including a silicon layer over a bottom substrate with an insulating layer therebetween;
   active regions comprising horizontally arranged source/drain regions at opposing ends of said silicon layer with a channel forming region formed between each pair of said source/drain regions;
   an insulating film formed on a side of said pair of said source/drain regions opposite to said channel forming region; and
   a hollow space formed in said insulating layer and extending to a bottom surface of said insulating film, said hollow space formed so as not to extend under a bottom surface of said pair of said source/drain regions,
   wherein said insulating film is formed from a portion of said silicon layer through oxidation; and a side edge of said hollow space is aligned with a side edge of said insulating film.

* * * * *